(12) United States Patent
Lim

(10) Patent No.: US 11,467,217 B2
(45) Date of Patent: Oct. 11, 2022

(54) CHARGE CAPACITY CALCULATION DEVICE AND METHOD FOR ENERGY STORAGE SYSTEM

(71) Applicant: LG CHEM, LTD., Seoul (KR)

(72) Inventor: Bo Mi Lim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 17 days.

(21) Appl. No.: 16/768,965

(22) PCT Filed: Feb. 20, 2019

(86) PCT No.: PCT/KR2019/002070
§ 371 (c)(1),
(2) Date: Jun. 2, 2020

(87) PCT Pub. No.: WO2019/164263
PCT Pub. Date: Aug. 29, 2019

(65) Prior Publication Data
US 2021/0215767 A1    Jul. 15, 2021

(30) Foreign Application Priority Data

Feb. 20, 2018   (KR) .................. 10-2018-0020003
Feb. 19, 2019   (KR) .................. 10-2019-0019143

(51) Int. Cl.
*G01R 31/367*       (2019.01)
*G01R 31/3842*     (2019.01)
(Continued)

(52) U.S. Cl.
CPC ......... *G01R 31/367* (2019.01); *G01R 31/389* (2019.01); *G01R 31/3842* (2019.01);
(Continued)

(58) Field of Classification Search
CPC .............. G01R 31/367; G01R 31/3842; G01R 31/389; G01R 31/3648; G01R 31/382; G01R 31/3828; G01R 31/387
See application file for complete search history.

(56) References Cited

U.S. PATENT DOCUMENTS 8,626,679 B2   1/2014   Cho et al.
10,267,864 B2  4/2019   Park et al.
(Continued)

FOREIGN PATENT DOCUMENTS

CN   102466786 A   5/2012
CN   103454592 A   12/2013
(Continued)

OTHER PUBLICATIONS

Ramadan et al., "Extended Kalman Filter for Accurate State of Charge Estimation of Lithium-based Batteries: a comparative analysis" International Journal of Hydrogen Energy 42 (2017) 29033-29046 (Year: 2017).*
(Continued)

*Primary Examiner* — John C Kuan
(74) *Attorney, Agent, or Firm* — Birch, Stewart, Kolasch & Birch, LLP

(57) ABSTRACT

Provided is a method of calculating a resistance and a capacitance of an energy storage system, including a current application step of applying a predetermined current having a constant value to the energy storage system; a first voltage measurement step of measuring a voltage of the energy storage system while the predetermined current is applied to the energy storage system; a second voltage measurement step of measuring a voltage of the energy storage system after breaking the predetermined current applied to the energy storage system; and a step of calculating a resistance (R) and a capacitance (C) of the energy storage system based on the voltage of the energy storage system measured in the
(Continued)

first voltage measurement step, the voltage of the energy storage system measured in the second voltage measurement step, and the predetermined current having the constant value.

5 Claims, 8 Drawing Sheets

(51) Int. Cl.
G01R 31/36 (2020.01)
G01R 31/3828 (2019.01)
G01R 31/387 (2019.01)
G01R 31/389 (2019.01)
G01R 31/382 (2019.01)

(52) U.S. Cl.
CPC ........ G01R 31/3648 (2013.01); G01R 31/382 (2019.01); G01R 31/387 (2019.01); G01R 31/3828 (2019.01)

(56) References Cited

U.S. PATENT DOCUMENTS

| | | | |
|---|---|---|---|
| 2005/0285568 A1 | 12/2005 | Hansen et al. | |
| 2011/0224928 A1* | 9/2011 | Lin | G01R 31/367 702/63 |
| 2014/0316728 A1 | 10/2014 | Zhong et al. | |
| 2015/0070024 A1 | 3/2015 | Kim et al. | |
| 2015/0280290 A1 | 10/2015 | Saha et al. | |
| 2015/0369874 A1 | 12/2015 | Park et al. | |
| 2015/0377974 A1 | 12/2015 | Choi | |
| 2016/0231387 A1* | 8/2016 | Hodges | G01R 31/389 |
| 2016/0252583 A1 | 9/2016 | Joe | |
| 2016/0252585 A1 | 9/2016 | Baba et al. | |
| 2017/0269164 A1 | 9/2017 | Heiries et al. | |

FOREIGN PATENT DOCUMENTS

| | | | |
|---|---|---|---|
| CN | 104113103 A | | 10/2014 |
| CN | 106054085 A | * | 10/2016 |
| CN | 106909716 A | * | 6/2017 |
| CN | 107167743 A | | 9/2017 |
| EP | 2 012 135 A1 | | 1/2009 |
| EP | 3 056 917 A1 | | 8/2016 |
| EP | 3 165 934 A1 | | 5/2017 |
| GB | 2532726 A | | 6/2016 |
| JP | 2010-71703 A | | 4/2010 |
| JP | 2013-178142 A | | 9/2013 |
| JP | 2014-109535 A | | 6/2014 |
| JP | 2015-215169 A | | 12/2015 |
| JP | 2016-99123 A | | 5/2016 |
| KR | 10-2000-0129962 A | | 12/2006 |
| KR | 10-2007-0030220 A | | 3/2007 |
| KR | 10-2013-0105123 A | | 9/2013 |
| KR | 10-2013-0110355 A | | 10/2013 |
| KR | 10-2015-0023204 A | | 3/2015 |
| KR | 10-2015-0043216 A | | 4/2015 |
| KR | 10-1529515 B1 | | 6/2015 |
| KR | 10-2015-0114403 A | | 10/2015 |
| KR | 10-2016-0000317 A | | 1/2016 |
| KR | 10-2016-0048666 A | | 5/2016 |
| KR | 10-2016-0069397 A | | 6/2016 |
| KR | 10-1707150 B1 | | 2/2017 |
| KR | 10-2017-0090455 A | | 8/2017 |
| WO | WO 2014/128904 A1 | | 8/2014 |
| WO | WO 2016/083758 A1 | | 6/2016 |

OTHER PUBLICATIONS

Santos et al., "Lead Acid Battery SoC Estimation Based on Extended Kalman Filter Method Considering Different Temperature Conditions" 2017 IEEE (Year: 2017).*

Zhu et al., "Online State of Charge EKF Estimation for LiFePO4 Battery Management Systems" 2012 IEEE International Symposium on Intelligent Signal Processing and Communication Systems (ISPACS 2012) Nov. 4-7, 2012 (Year: 2012).*

Machine Translation for Japanese Notice of Reasons of Refusal dated Mar. 31, 2021 (Year: 2021).*

Sharma et al, "Fisher Identifiability Analysis for a Periodically-Excited Equivalent-Circuit Lithium-Ion Battery Model" 2014 American Control Conference (ACC), Jun. 4-6, 2014. Portland, Oregon, USA (Year: 2014).*

European Search Report for European Patent Application No. 19756861.1 dated Feb. 17, 2021.

Jiang Shugang: "A Parameter Identification Method for a Battery Equivalent Circuit Model", SAE Technical Paper Series, Apr. 12, 2011, pp. 1-9, XP055773471.

Yang Jufeng et al: "Improved Battery Parameter Estimation Method Considering Operating Scenarios for HEV/EV Applications", Energies, vol. 10, No. 1, Dec. 22, 2016, pp. 1-20, XP055773508.

International Search Report (PCT/ISA/210) issued in PCT/KR2019/002070, dated May 22, 2019.

* cited by examiner

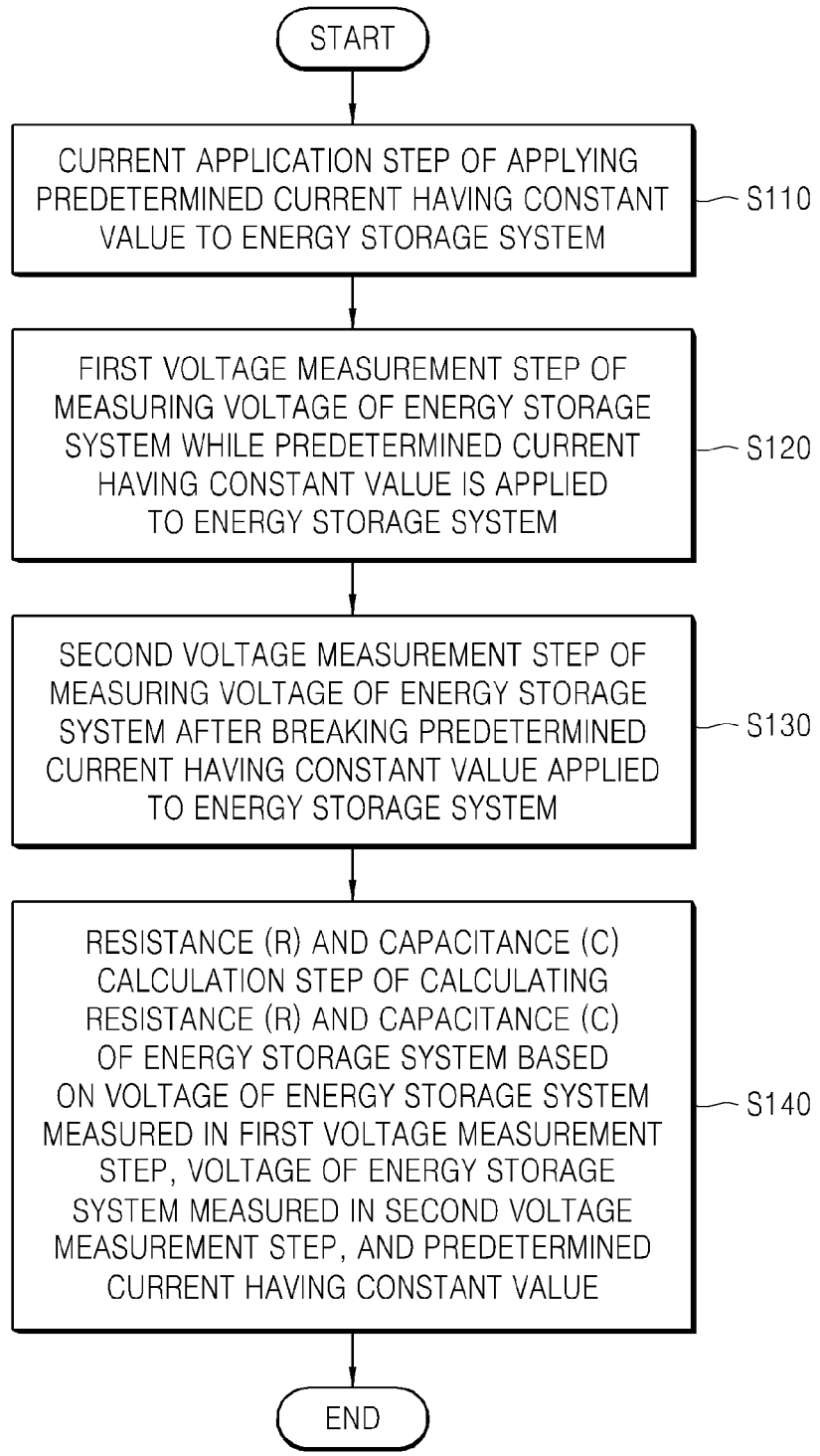

[FIG 2]
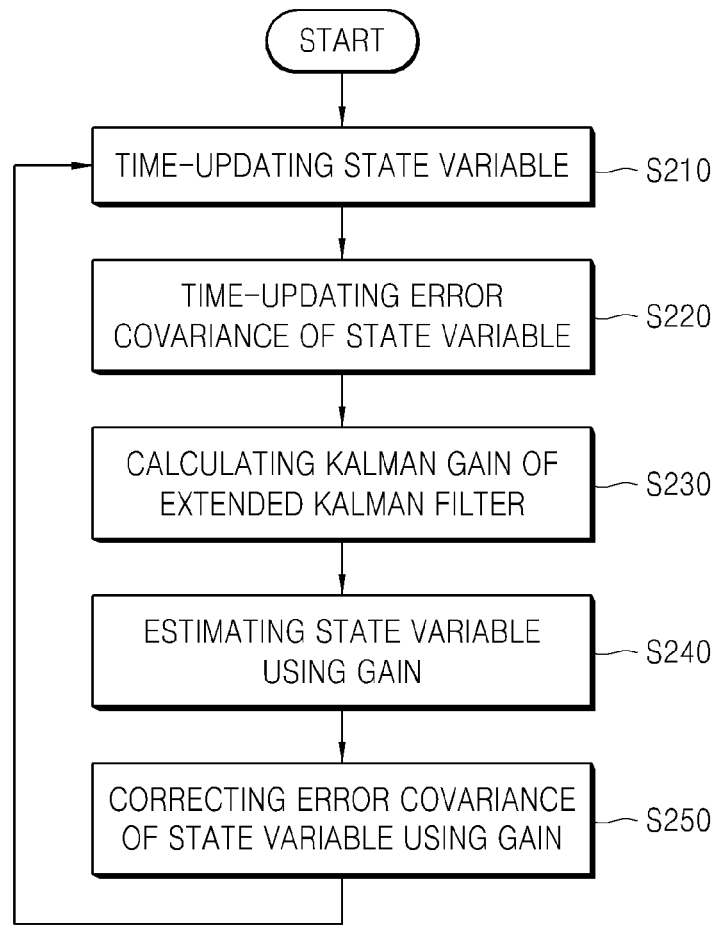

| | Cycle Start | | |
|---|---|---|---|
| DISCHARGING CC | Constant current | 1/2 Nominal Current | SOC setting |
| | End condition | *5% OF REFERENCE DISCHARGING CAPACITY | |
| rest | | 30min | |
| DISCHARGING CC | Constant current | C-rate | C-RATE DISCHARGING DCIR MEASUREMENT |
| | End condition | 30 sec | |
| rest | | 30min | |
| CHARGING CC | Constant current | 1/2 Nominal Current | SOC setting |
| | End condition | 100% OF IMMEDIATE DISCHARGING CAPACITY | |
| rest | | 30min | |
| CHARGING CC | Constant current | C-rate | C-RATE CHARGING DCIR MEASUREMENT |
| | End condition | 30 sec | |
| rest | | 30min | |
| DISCHARGING CC | Constant current | 1/2 Nominal Current | SOC setting |
| | End condition | 100% OF IMMEDIATE CHARGING CAPACITY | |
| rest | | 30min | SOC 5% UNIT PULSE 0.1 C-RATE MEASUREMENT |
| | Cycle Start | | |

[FIG. 3]

[FIG 4]
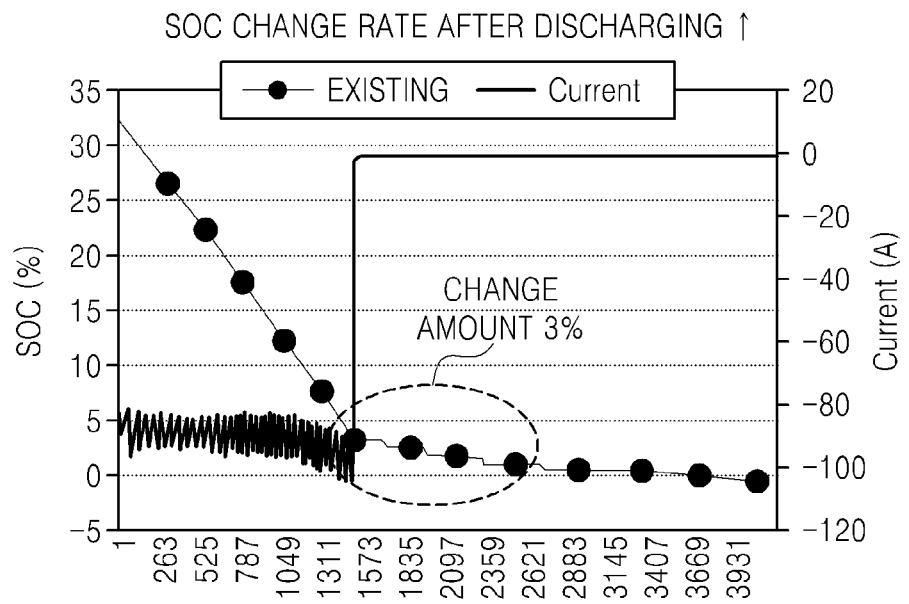
(a)
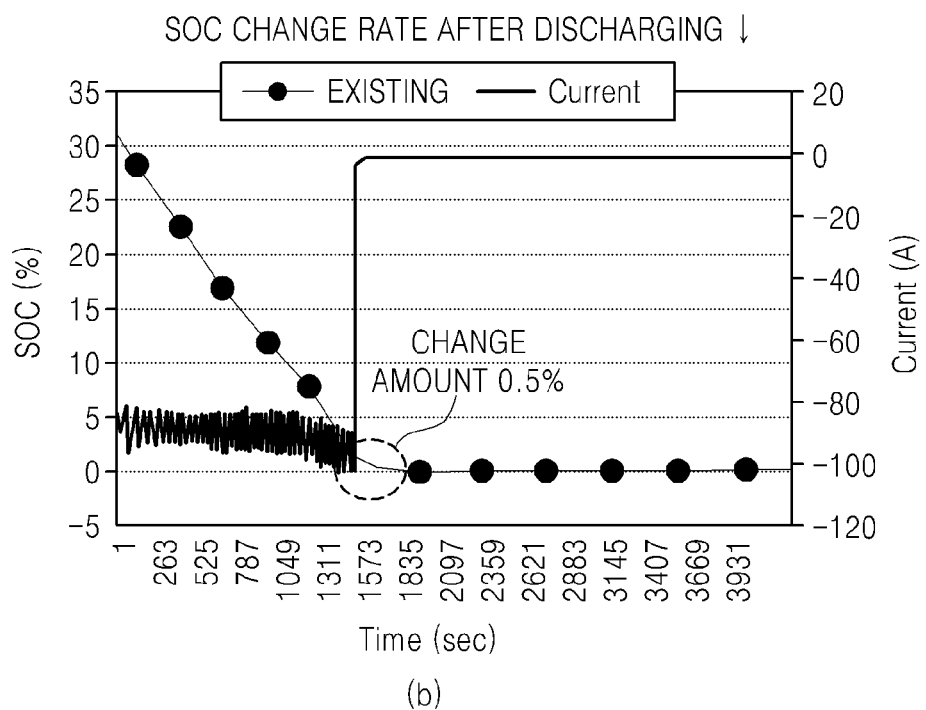
(b)

[FIG. 5]
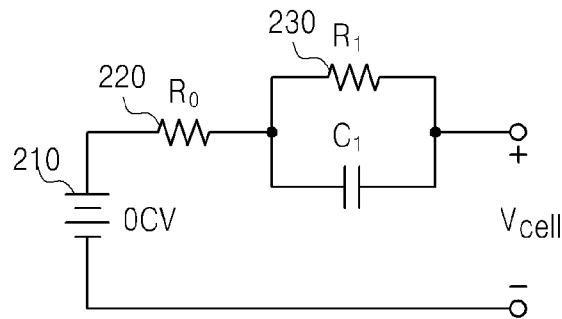
[FIG. 6]
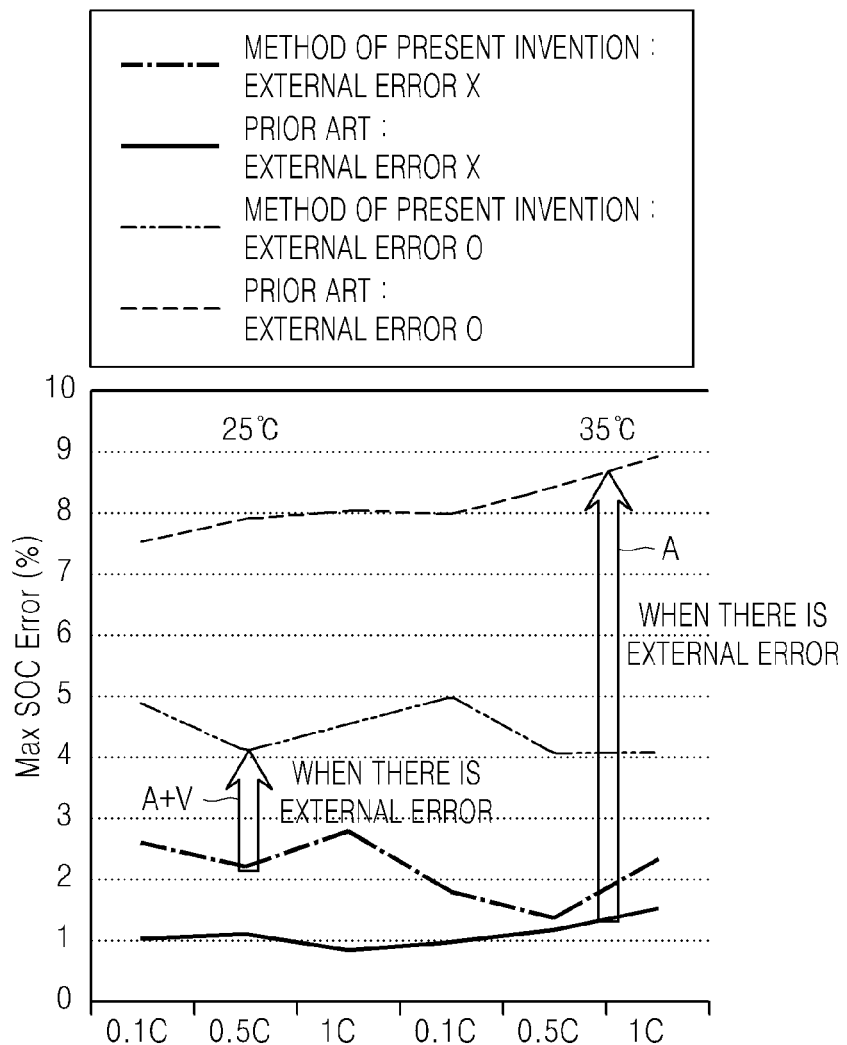

[FIG 7]
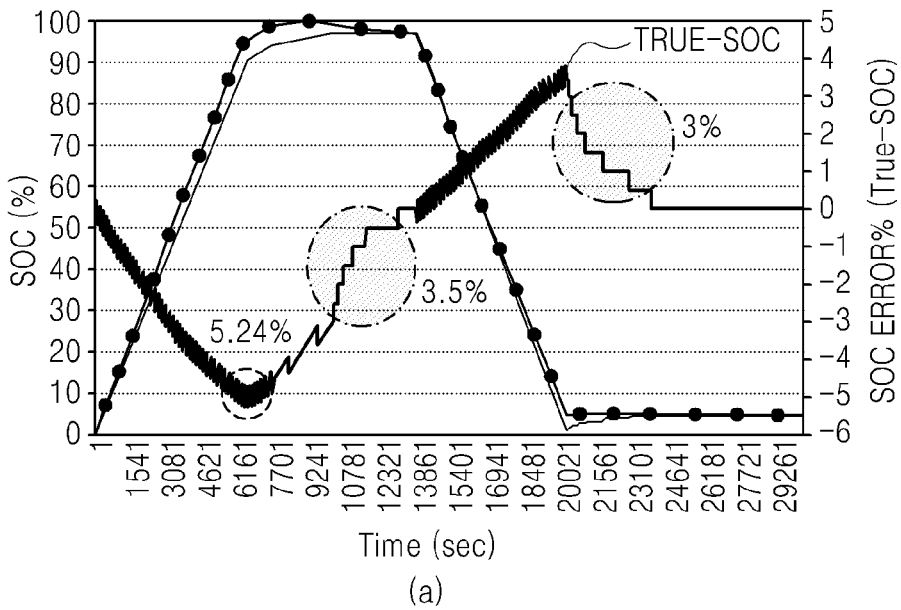
(a)
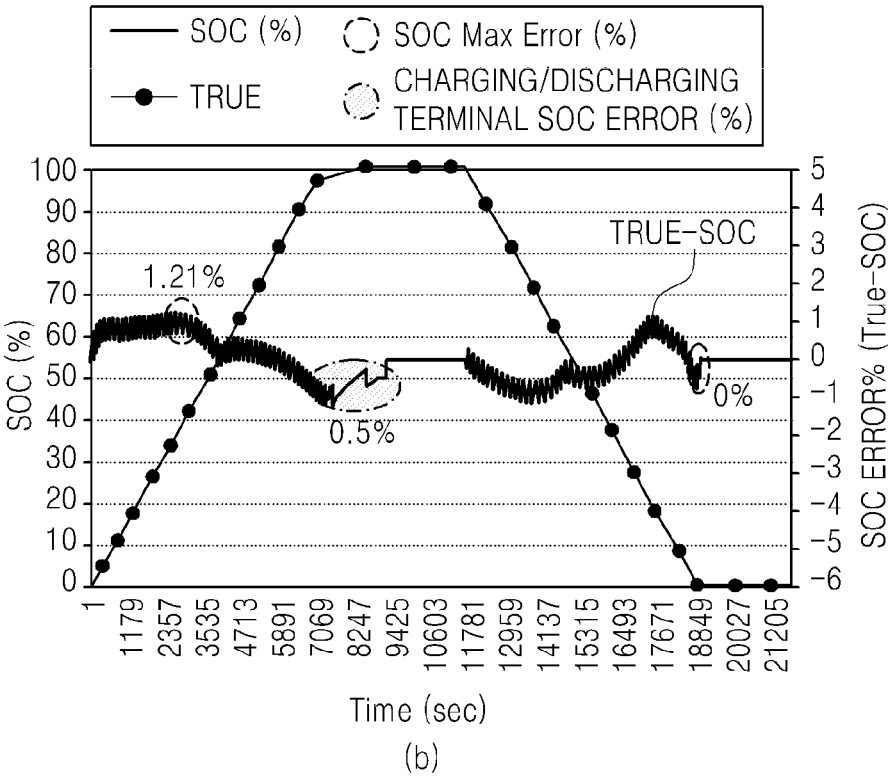
(b)

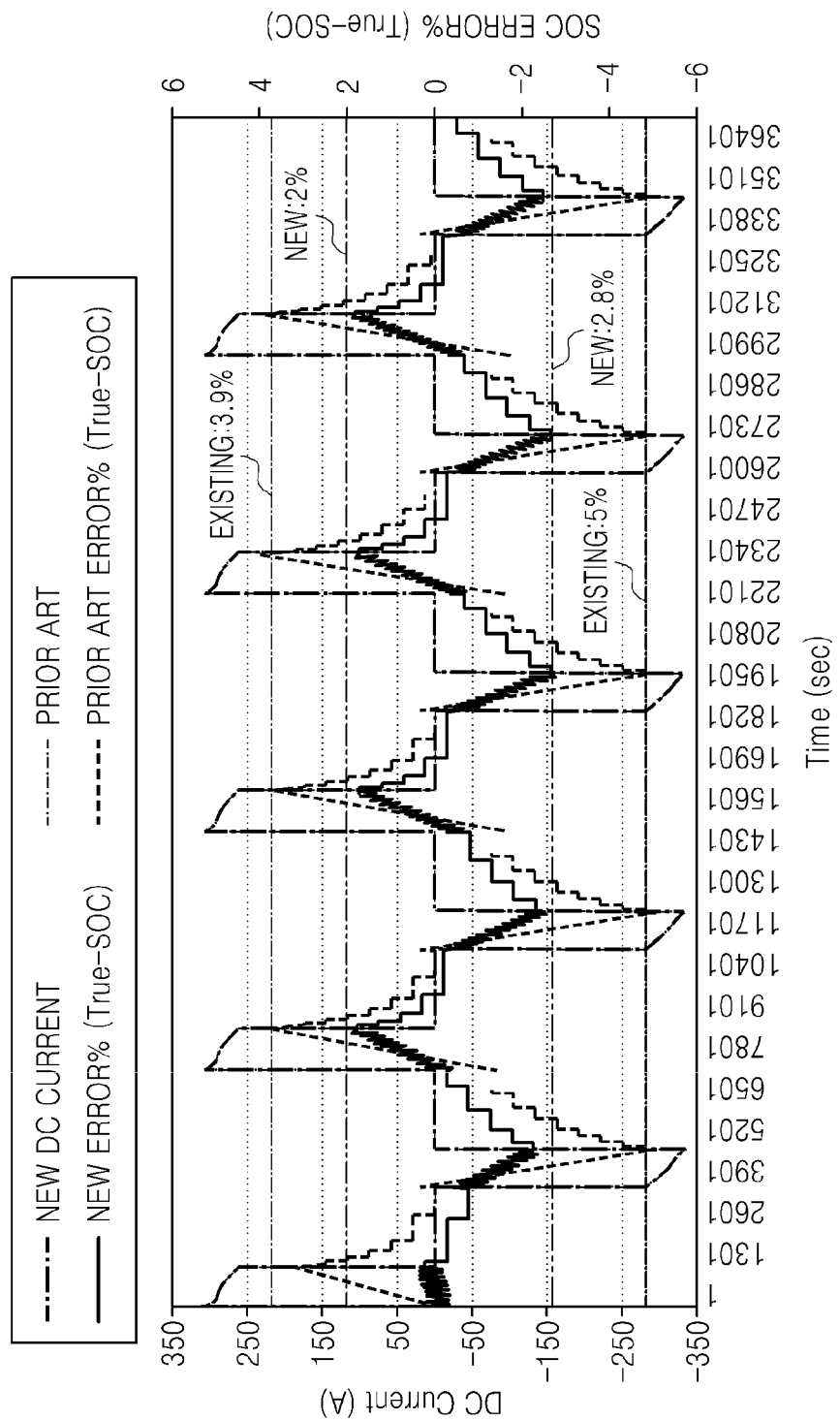
[FIG. 8]

[FIG. 9]
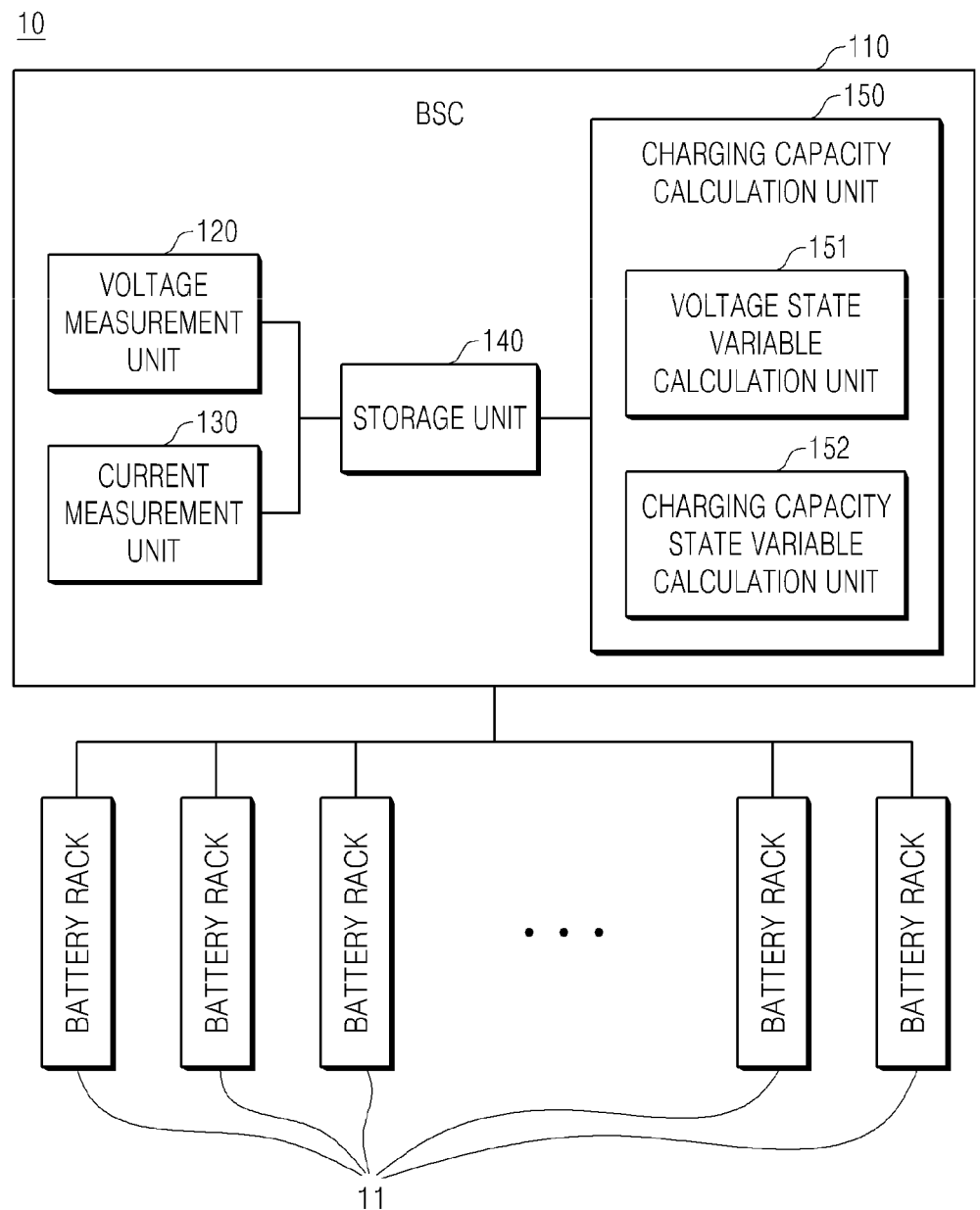

CHARGE CAPACITY CALCULATION DEVICE AND METHOD FOR ENERGY STORAGE SYSTEM

TECHNICAL FIELD

The present invention relates to an apparatus and a method for calculating the charging capacity of an energy storage system.

More particularly, the present invention relates to a device and method for accurately calculating a charging capacity of an energy storage system by increasing the accuracy of a voltage model used in an extended Kalman filter.

BACKGROUND ART

With the development of the industry, the demand for electric power is increasing, and the gap of electric power usage amounts between day and night, season, and day is increasing. Recently, for this reason, a number of techniques are rapidly being developed to reduce the peak load by utilizing the surplus electric power of the system.

A typical example of these technologies is an energy storage system in which the surplus electric power of the system is stored in the battery or the insufficient electric power of the system is supplied from the battery.

In order to maintain the life of the energy storage system for a long time and to use it safely, the energy storage system must be operated within the proper charging capacity range, and the life time of the energy storage system greatly changes according to the number of charging/discharging cycles.

Therefore, it is important to understand the state of the energy storage system by measuring the current, voltage and temperature thereof and accurately measuring the charging capacity (SOC) of the energy storage system.

A conventional method of calculating the charging capacity (SOC) of an energy storage system was a current integration method. However, in the conventional current integration method, there is an error in the current sensor for measuring the current, and in the course of integrating the current, the error of the current sensor is also accumulated, so that it is difficult to calculate the accurate charging capacity.

As another conventional technique for solving such a conventional problem, there were a current integration method for calculating a charging capacity based on a current measured by the current sensor when the charging capacity of the energy storage system is calculated and a method of calculating the charging capacity by substituting the voltage model of the energy storage system into the extended Kalman filter.

However, even in the technology using the current integration method and the voltage model of the energy storage system in the conventional extended Kalman filter, since the accuracy of the resistance (R) and capacitance (C) used to calculate the voltage model of the energy storage system is low, there is still a problem that an error occurs in the final charging capacity.

Therefore, the present invention proposes a device and method for reducing the charging capacity error of an energy storage system by accurately calculating the resistance (R) and capacitance (C) used to calculate the voltage model of the energy storage system and performing final calculation using the Kalman filter having a high specific weight of the voltage model.

(Patent Document 1) KR2013-0105123A

DISCLOSURE OF THE INVENTION

Technical Problem

The present invention provides a device and method for accurately calculating a charging capacity of an energy storage system by accurately calculating a voltage model of an energy storage system.

More particularly, the present invention provides a device and method for accurately calculating a charging capacity by accurately calculating a resistance (R) and a capacitance (C) used in a voltage model of an energy storage system and substituting an accurate voltage model into an extended Kalman filter.

Technical Solution

Embodiments of the present invention provide a method of calculating a resistance (R) and a capacitance (C) of an energy storage system. The method includes: a current application step of applying a predetermined current having a constant value to the energy storage system; a first voltage measurement step of measuring a first voltage of the energy storage system while the predetermined current is applied to the energy storage system; a second voltage measurement step of measuring a second voltage of the energy storage system after breaking the predetermined current; and a resistance (R) and capacitance (C) calculation step of calculating a resistance (R) and a capacitance (C) of the energy storage system based on the first voltage of the energy storage system measured in the first voltage measurement step, the second voltage of the energy storage system measured in the second voltage measurement step, and the predetermined current.

The predetermined current applied in the current application step may be between a minimum current value is capable of measuring a resistance and a capacitance value of the energy storage system and a 2c-rate.

The predetermined current applied in the current application step may be between a minimum current value capable of measuring a resistance and a capacitance value of the energy storage system and a 0.1c-rate.

The method may further include: a state variable calculation step of calculating a state variable of an extended Kalman filter using the resistance and the capacitance of the energy storage system; and an energy storage system charging capacity calculation step of substituting the state variable into the extended Kalman filter to calculate a charging capacity of the energy storage system.

The extended Kalman filter may repeatedly perform: time-updating the state variable; time-updating an error covariance of the state variable; calculating a Kalman gain of the extended Kalman filter; estimating a state variable using the gain; and correcting the error covariance of the state variable using the gain.

The state variable calculation step may include: a charging capacity state variable calculation step of generating a charging capacity state variable for the charging capacity of the energy storage system; and a voltage state variable calculation step of generating a voltage state variable for the voltage of the energy storage system.

The charging capacity state variable calculation step may calculate the charging capacity state variable using a current integration method of integrating the current measured in the energy storage system, wherein the calculated charging capacity state variable may be time-updated according to Equation 1 below.

$$SOC[k+1] = SOC[k] - \frac{i[k]\Delta t}{Q_{capacity}}$$ (Equation 1)

(wherein Q_capacity: capacity of secondary battery, k: time index, I[k]: current measured at time index k, t: time)

The voltage state variable calculation step may calculate a voltage state variable of the energy storage system using a voltage model circuit, wherein the calculated voltage state variable may be time-updated according to Equation 2 below.

$$V_1[k+1] = \exp\left(-\frac{\Delta t}{R_1 C_1}\right) V_1[k] + R_1\left(1 - \exp\left(-\frac{\Delta t}{R_1 C_1}\right)\right) I[k]$$ (Equation 2)

(wherein R1 and C1 are resistance and capacitance values included in the circuit model of FIG. 5, k: time index, I[k]: current measured at time index k, t: time)

The voltage model circuit may include: an open voltage source for outputting a predetermined voltage according to a current value flowing through the energy storage system; one or more resistors; and one or more capacitors.

In other embodiments of the present invention, an energy storage system includes: a plurality of battery racks; and a battery section controller (BSC) for controlling the plurality of battery racks, wherein the BSC includes: a voltage measurement unit for measuring an output voltage of the energy storage system; a current measurement unit for measuring an output current of the energy storage system; a storage unit in whiCh a resistance (R) and a capacitance (C) look-up table of a temperature-dependent energy storage system calculated with a predetermined current having a constant value are stored; and a charging capacity calculation unit for calculating a charging capacity of the energy storage system based on a lookup table.

The voltage measurement unit may measure: a first voltage while the predetermined current is applied to the energy storage system; and a second voltage after the current applied to the energy storage system is cut off.

The charging capacity calculation unit may include: a voltage state variable calculation unit for calculating a voltage state variable for a voltage of the energy storage system based on a resistance and a capacitance of the lookup table; and a charging capacity state variable calculation unit for calculating a charging capacity state variable for a charging capacity of the energy storage system using a current integration method for integrating the measured output current, wherein the calculated voltage state variable and the charging capacity state variable may be substituted into the Kalman filter to calculate the charging capacity of the energy storage system.

Advantageous Effects

The present invention may accurately calculate the voltage model of the energy storage system by accurately calculating the resistance (R) and the capacitance (C) used in the voltage model of the energy storage system.

Further, the present invention may accurately calculate the charging capacity of the energy storage system by calculating the accurate voltage model of the energy storage system.

BRIEF DESCRIPTION OF THE DRAWINGS

FIG. 1 is a flowchart illustrating a method of calculating a resistance (R) and a capacitance (C) used for calculating a voltage model of the energy storage system of the present invention.

FIG. 2 is a flowchart illustrating an operation of an extended Kalman filter according to an embodiment of the present invention.

FIG. 3 is a view illustrating an actual experimental method (DCPR) for calculating a resistance R and a capacitance C used for calculating a voltage model of an energy storage system according to an embodiment of the present invention.

FIG. 4 is a graph comparing changes in charging capacity after discharging calculated based on the conventional voltage model and changes in charging capacity calculated through the voltage model calculating method of the present invention.

FIG. 5 is a voltage model circuit for calculating the voltage of the energy storage system according to the embodiment of the present invention.

FIG. 6 is a view for comparing the charging capacity calculated using the method of calculating the charging capacity of the energy storage system and the charging capacity calculated by the prior art (using current integration method only) through the resistance and capacitance calculation method used to calculate the voltage model of the energy storage system of the present invention.

FIG. 7 is a view for comparing charging capacity calculated using the method of calculating the charging capacity of the energy storage system and the charging capacity calculated by the conventional algorithm (the conventional technique using a voltage model calculated at a high c-rate and a low-weight algorithm of a voltage model in a Kalman filter) through the resistance and capacitance calculation method used to calculate the voltage model of the energy storage system of the present invention by reflecting the error condition.

FIG. 8 is a view for comparing the results of the capacity test using the existing algorithm and the charging capacity estimation method of the present invention.

FIG. 9 is a view illustrating a configuration of an energy storage system according to an embodiment of the present invention.

MODE FOR CARRYING OUT THE INVENTION

Hereinafter, embodiments of the present invention will be described in detail with reference to the accompanying drawings so that those skilled in the art may easily carry out the present invention. The present invention may, however, be embodied in different forms and should not be constructed as limited to the embodiments set forth herein. Parts not relating to description are omitted in the drawings in order to clearly describe the present invention and like reference numerals refer to like elements throughout.

Although the terms "initial," "second," etc., may be used herein to describe various elements, these elements should not be limited by these terms. The above terms are used only to distinguish one component from another. For example, an initial component may be referred to as a second component and vice versa without departing from the scope of the present invention. Terms used in this specification are used to describe specific embodiments, and are not intended to limit the scope of the present invention. The singular expressions include plural expressions unless the context clearly dictates otherwise.

Throughout the specification, when a portion is referred to as being "connected" to another portion, it includes not only "directly connected" but also "electrically connected" with another element therebetween. Furthermore, when it is described that one comprises (or includes or has) some elements, it should be understood that it may comprise (or include or has) only those elements, or it may comprise (or include or have) other elements as well as those elements if there is no specific limitation. The term "~ing operation" or "operation of ~ing" used throughout the specification does not mean "operation for ~ing".

Terms used in this specification may be currently widely used general terms in consideration of functions in the present invention but may vary according to the intents of those skilled in the art, precedents, or the advent of new technology. Additionally, in certain cases, there may be terms the applicant selects arbitrarily and in this case, their meanings are described in a corresponding description part of the present invention. Accordingly, terms used in the present invention should be defined based on the meaning of the term and the entire contents of the present invention instead of the simple term name.

1. Method of Calculating Resistance (R) and Capacitance (C) Used to Calculate Voltage Model of Energy Storage System According to Embodiment of Present Invention.

The charging capacity of an energy storage system was calculated using a current integration method as a method of calculating the charging capacity of a conventional energy storage system. The current integration method determines the charging capacity by integrating the charging current and the discharging current with time. However, in relation to the current integrating method, there is an error in the current sensor for measuring the charging current and the discharging current. Such error accumulates as the time for integrating the current accumulates, so that the accuracy of the charging capacity finally calculated by the current accumulation method is lowered.

Conventionally, in order to solve such a problem, both the voltage model and the current integration method of the energy magnetic field system were substituted into the extended Kalman filter to obtain a more accurate charging capacity.

But, conventionally, since the resistance R and the capacitance C used to calculate the voltage model of the energy storage system, which are substituted for the extended Kalman filter, are not calculated accurately, there was still an error in the charging capacity of the energy storage system.

Therefore, the present invention proposes a method of accurately calculating the resistance (R) and the capacitance (C) used to calculate the voltage model of the energy storage system.

FIG. 1 is a method of calculating a resistance (R) and a capacitance (C) used to calculate a voltage model of the energy storage system of the present invention.

The present invention uses the resistance (R) and the capacitance (C) of the energy storage system to calculate the voltage model of the energy storage system.

The method of calculating the resistance (R) and capacitance (C) of the energy storage system of the present invention is characterized by using a low c-rate current.

In the present invention, the method of calculating the resistance (R) and the capacitance (C) of the energy storage system may be calculated using the DCPR method as shown in FIG. 3.

Hereinafter, a method of calculating the resistance (R) and the capacitance (C) of the energy storage system of the present invention will be described with reference to FIG. 1 and FIG. 3.

1-1. Current Application Step S110 of Applying Predetermined Current Having Constant Value to Energy Storage System The present invention applies a predetermined current having a constant value to an energy storage system, measures the voltage change of the energy storage system, and based on this, calculates the resistance (R) and the capacitance (C) of the energy storage system.

The current application step is a step of applying a predetermined current having a constant value to an energy storage system charged to a predetermined charging capacity. After applying a predetermined current having a constant value to the energy storage system in such a way, the first voltage measurement step is performed. At this time, the predetermined current having the constant value to be applied is a current having a low c-rate. The c-rate may mean the intensity of the current.

The current having the constant value applied uses a current having a total of 2 to 3 c-rate or more. However, the inventor of the present invention invented that the resistance and the capacitance value of the energy storage system may be more accurately calculated by applying a c-rate current lower than 2 to 3c-rate.

Accordingly, in the present invention, the low c-rate current may be a current having a value between a minimum current value and a 2c-rate value capable of measuring the resistance and capacitance of the energy storage system.

Preferably, the current having the low c-rate may be a current of 0.1 c-rate, which corresponds to $\frac{1}{10}$ of the current of 1 c-rate.

When a current having a high c-rate is applied, the voltage of the energy storage system changes after the application of the current. As compared to this, when a current having a low c-rate is applied, after the current application is completed, the voltage of the energy storage system may be stabilized quickly, and the more accurate resistance (R) and capacitance (C) of an energy storage system may be calculated.

1-2. First Voltage Measurement Step S120 of Measuring Voltage of Energy Storage System while Predetermined Current Having Constant Value is Applied to Energy Storage System The first voltage measurement step of the present invention is a step of measuring a voltage of the energy storage system while a predetermined current having a constant value flows through the energy storage system.

Specifically, when a predetermined current having a constant value is applied to the energy storage system charged to a predetermined charging capacity in the voltage application step, the voltage of the energy storage system varies by a predetermined value. The voltage of the energy storage system measured at this time is used in the step of calculating the resistance (R) and the capacitance (C), which will be described later.

1-3. Second Voltage Measurement Step S130 of Measuring Voltage of Energy Storage System after Breaking Predetermined Current Having Constant Value Applied to Energy Storage System The second voltage measurement step of the present invention is a step of terminating the application of a predetermined current having a constant value after the first voltage measurement step and measuring the voltage of the energy storage system.

Specifically, when a predetermined current having a constant value is applied to the energy storage system and then cut off, the voltage of the energy storage system changes. For example, when current is applied in the charging direction and current is cut off, the voltage of the energy storage system may drop, and when a current is applied in the discharging direction and the current is cut off, the voltage of the energy storage system may rise. The voltage change of the energy storage system measured at this time is used in the step of calculating the resistance (R) and the capacitance (C), which will be described later.

1-4. Resistance (R) and Capacitance (C) Calculation Step S140 of Calculating Resistance (R) and Capacitance (C) of Energy Storage System Based on Voltage of Energy Storage System Measured in First Voltage Measurement Step, Voltage of Energy Storage System Measured in Second Voltage Measurement Step, and Predetermined Current Having Constant Value The resistance (R) and capacitance (C) calculation step is a step of calculating the resistance (R) and capacitance (C) of the energy storage system based on the voltage of the energy storage system measured in the first voltage measurement step, the voltage of the energy storage system measured in the second voltage measurement step, and the predetermined current having a constant value. Specifically, since a predetermined current having a constant value applied to the energy storage system is known and a voltage corresponding to the flow of a predetermined current having the constant value is known, the resistance (R) and the capacitance (C) of the energy storage system may be calculated.

For example, in the circuit of FIG. 5, the Vcell is a sum of an OCV voltage, a voltage applied to R0, and a voltage applied to C1. On the other hand, the OCV value is a value preset according to the charging capacity of the battery cell. The resistance value of R0 is a value obtained by dividing the difference between the Vcell voltage Vt measured at time t and the Vcell voltage Vt+1 measured at time t+1 by the low c-rate current flowing in the circuit. The voltage applied to R0 is also known. Therefore, since the voltage value and the current value applied to C1 are known, the R1 value and the C1 value may be calculated.

In this way, the resistance (R) and the capacitance (C) of the energy storage system, which are repeatedly calculated while changing the temperature of the energy storage system, may be stored in the form of a resistance and capacitance lookup table of the temperature storage system.

Meanwhile, since a current having a low c-rate (0.1c-rate) is used in the present invention, the voltage of the energy storage system measured in the second voltage measurement step is quickly stabilized after the current does not flow, the voltage of the energy storage system when the current flows and the voltage of the energy storage system when the current does not flow are accurately measured.

Therefore, if the voltage model of the energy storage system is calculated using the resistance (R) and the capacitance (C) of the energy storage system and based on this, the charging capacity of the energy storage system is calculated, the charging capacity of the energy storage system may be accurately calculated.

Meanwhile, in the present invention, there may be a predetermined rest time between the current application step and the first voltage measurement step and between the first voltage measurement step and the second voltage measurement step.

Hereinafter, a method of accurately calculating the voltage model of the energy storage system using the resistance (R) and capacitance (C) calculation methods of the energy storage system of the present invention and based on this, calculating the charging capacity of the energy storage system will be described.

2. Method for Calculating Charging Capacity of Energy Storage System of Present Invention.

The charging capacity of the conventional energy storage system is calculated by substituting the voltage and current integration models into the state variables of the extended Kalman filter. However, conventionally, the values of the resistance (R) and capacitance (C) used to calculate the voltage model are not accurately calculated, so that an error occurs in the calculated charging capacity.

Specifically, conventionally, when calculating the resistance (R) and the capacitance (C) used to calculate the voltage model, they were calculated using high c-rate currents of about 2 to 3 c-rates.

However, in the present invention, when calculating the resistance (R) and the capacitance (C) used in calculating the voltage model, the calculation accuracy of the resistance (R) and the capacitance (C) is increased by using a low c-rate current.

On the other hand, the low c-rate current may be a value between a minimum current value and a 2c-rate capable of measuring the resistance and capacitance of the energy storage system.

Preferably, the current having the low c-rate may be a current of 0.1 c-rate, which corresponds to 1/10 of the current of 1 c-rate. FIG. 4 is a graph comparing changes in charging capacity after discharging calculated based on the conventional voltage model and changes in charging capacity calculated through the voltage model calculating method of the present invention.

Referring to FIG. 4, when the voltage model is calculated based on the resistance R and the capacitance C calculated by the conventional method, the rate of change of the charging capacity (3%) calculated by the extended Kalman filter after discharging is large.

It is normal that there is no change in the charging capacity after discharging but the conventional method has a rate of change of 3%, so that the conventional method is inaccurate.

However, as in the above present invention, when the voltage model is calculated based on the resistance R and the capacitance C calculated using the low c-rate current, the rate of change of the charging capacity (0.5%) calculated by the extended Kalman filter after discharging is very small.

That is, since the rate of change of the charging capacity is small after discharging, the present invention has an effect of more accurately calculating the charging capacity.

Therefore, by using the charging capacity calculating method of the energy storage system of the present invention, it is possible to calculate the charging capacity more accurately than the conventional one.

FIG. 2 is a flowchart illustrating an operation of an extended Kalman filter according to an embodiment of the present invention.

On the other hand, the extended Kalman filter is an adaptive software algorithm capable of statistically estimating the state of the system in consideration of externally measurable variables and system disturbance (external error) for dynamic systems.

Specifically, the extended Kalman filter repeatedly performs time-updating a state variable (S210), time-updating the error covariance of the state variable (S220), calculating a Kalman gain of the extended Kalman filter (S230), estimating a state variable using the calculated Kalman gain (S240), and correcting the error covariance of the state variable using the gain (S250).

That is, the Extended Kalman Filter may be a method of reducing the error by repeatedly performing estimation→correction→estimation→correction.

In the present invention, the state equation of the extended Kalman filter is configured to include a state variable and updates the state variable over time. As the state variables, the charging capacity state variable of the energy storage system and the voltage state variable of the energy storage system are used.

2.1 Calculating Charging Capacity State Variable of Energy Storage System, which is One of State Variables The method of calculating a charging capacity among the state variables of the energy storage system of the present invention calculates the charging capacity of the energy storage system by measuring the current of the energy storage system and integrating the measured current.

The method of measuring the current of the energy storage system may use the current information of the energy storage system measured by the energy storage system control unit that controls and manages the energy storage system.

That is, in relation to the initial value of the charging capacity state variable, the value SOC1 may be calculated by measuring the current in the energy storage system and integrating it by the logarithmic integration method.

The charging capacity state variable of the energy storage system calculated by the above-described method may be time-updated in the extended Kalman filter by the following Equation 1.

$$SOC[k+1] = SOC[k] - \frac{i[k]\Delta t}{Q_{capacity}} \quad \text{(Equation 1)}$$

(wherein Q_capacity: capacity of secondary battery, k: time index, I[k]: current measured at time index k, t: time)

2.2 Method of Calculating Voltage State Variable of Energy Storage System Among State Variables.

A method of calculating the voltage state variable of the energy storage system among the state variables of the present invention may be calculated using the voltage model circuit of FIG. 5.

The voltage model circuit of FIG. 5 includes an open voltage source 210 that varies according to a predetermined current value flowing in the energy storage system, at least one of resistors R0 (220) and R1 (230), and at least one capacitor C1. The values of the resistors R0 (220) and R1 (230) and the capacitor C1 constituting the voltage model circuit may be detected in the resistance and capacitance lookup table of the energy storage systems for each temperature, which is calculated using a current with a constant value of low c-rate and stored according to an embodiment of the present invention.

When values of the resistance and capacitance constituting the voltage model circuit are detected in the resistance and capacitance lookup tables of the energy storage system for each temperature, the value V1, which is an initial value of the voltage state variable, may be calculated.

Specifically, since the values of R1, C1, and R0 and the currents flowing through R1, C1, and R0, respectively, are known, the value of V1, which is the voltage applied to C1, may be calculated.

On the other hand, the charging capacity state variable of the energy storage system calculated by the above-described method may be time-updated in the extended Kalman filter by the following Equation 2.

$$V_1[k+1] = \exp\left(-\frac{\Delta t}{R_1 C_1}\right) V_1[k] + R_1\left(1 - \exp\left(-\frac{\Delta t}{R_1 C_1}\right)\right) I[k] \quad \text{(Equation 2)}$$

(wherein R1 and C1 are resistance and capacitance values included in the circuit model of FIG. 5, k: time index, I[k]: current measured at time index k, t: time)

2.3 Energy Storage System Charging Capacity Calculation Step of Calculating Charging Capacity of Energy Storage System On the other hand, Equation 3 is an equation that expresses Equation 1 (an equation that time-updates a charging capacity state variable) and Equation 2 (an equation that time-updates a voltage state variables) used as state variables in the extended Kalman filter of the present invention by the vector state equation.

$$\begin{bmatrix} SOC_{k+1} \\ V_{1,k+1} \end{bmatrix} = \begin{bmatrix} 1 & 0 \\ 0 & \exp\left(-\frac{\Delta t}{R_1 C_1}\right) \end{bmatrix} \begin{bmatrix} SOC_k \\ V_{1,k} \end{bmatrix} + \begin{bmatrix} \frac{\Delta t}{Capacity} \\ R_1\left(1 - \exp\left(-\frac{\Delta t}{R_1 C_1}\right)\right) \end{bmatrix} I_k \quad \text{(Equation 3)}$$

(wherein capacity: capacity of secondary battery, R1 and C1 are resistance and capacitance values included in the circuit model of FIG. 5, k: time index, I[k]: current measured at time index k, t: time)

The charging capacity of the energy storage system may be accurately calculated by inserting Equation 3 into the initial value of the extended Kalman filter (when k=0).

The extended Kalman filter used in the present invention may reduce the error of the charging capacity calculated by repeatedly performing the following procedure (time update (estimation)→measurement update (correction)→time update (estimation)→measurement update (correction)).

| Time Update("Predict") | Measurement Update("Correct") |
|---|---|
| (1)Project the state ahead $\hat{x}_k^- = A\hat{x}_{k-1} + Bu_k$ (2)Project the error covariance ahead $P_k^- = AP_{k-1}A^T + Q$ | (1)Compute the Kalman gain $K_k = P_k^- H^T(HP_k^- H^T + R)^{-1}$ (2)Update estimate with measurement $\hat{x}_k = \hat{x}_k^- + K_k(z_k - H\hat{x}_k^-)$ (3)Update the error covariance $P_k = (I - K_k H) P_k^-$ |

(P: error covariance, H: transform coefficient, K: Kalman gain, Q: standard deviation with respect to true value, A:

state variable (Equation 3), z: observed value, R: error from observed true value, k: degree of step, u: additional input value, I: unit matrix)

Then, the error of the extended Kalman filter may be calculated more accurately as the error of the inputted state variable becomes smaller.

In other words, in the present invention, an accurate voltage model is calculated based on the values of the resistance (R) and capacitance (C) calculated using the current with the low c-rate, and is substituted into the extended Kalman filter, so that the error may be reduced as compared with the voltage model calculated by the prior art.

<Specific Experimental Data>

Hereinafter, the voltage model of the energy storage system is generated using the resistance (R) and capacitance (C) of the energy storage system measured using the low c-rate, which is the characteristic of the present invention, and based on this, the result data of calculating the charging capacity of the energy storage system and the result data of the charging capacity calculated by the conventional techniques are compared and described.

Table 1 and FIG. 6 are a table and a view for comparing the charging capacity calculated using the method of calculating the charging capacity of the energy storage system and the charging capacity calculated by the prior art (using current integration method only) through the resistance and capacitance calculation method used to calculate the voltage model of the energy storage system of the present invention.

In comparison to this, if there is an external error, it may be confirmed that the SOC error calculated by the method of the present invention is smaller than the SOC error calculated by the conventional technique. Further, when an external error exists, even if looking at the rate of SOC error growth, the error of SOC calculated by the method of the present invention is about 3% at maximum but the SCO error calculated by the prior art is more than 2 times greater, exceeding 7% at maximum.

Therefore, in the absence of an external error, the prior art is more accurate, but in an environment used in an actual energy storage system, an error occurs in the current sensor, so that the method of calculating the charging capacity of an energy storage system in an actual use environment is more accurate than the method of the present invention.

Meanwhile, Table 2 and FIG. 7 are a table and a view for comparing charging capacity calculated using the method of calculating the charging capacity of the energy storage system and the charging capacity calculated by the conventional algorithm (the conventional technique using a voltage model calculated at a high c-rate and a low-weight algorithm of a voltage model in a Kalman filter) through the resistance and capacitance calculation method used to calculate the voltage model of the energy storage system of the present invention by reflecting the error condition.

TABLE

| | | Experimental environment | | | | | |
|---|---|---|---|---|---|---|---|
| | | Temperature | | | | | |
| | | 25 degrees | | | 35 degrees | | |
| | C-rate | 0.1 C | 0.3 C | 1 C | 0.1 C | 0.3 C | 1 C |
| Method of present invention | External error X | 2.59% | 2.21% | 2.79% | 1.8% | 1.37% | 2.32% |
| | External error ○ | 4.88% | 4.11% | 4.56% | 4.99% | 4.07% | 4.09% |
| | SOC error increase amount | 2.29% | 1.90% | 1.77% | 3.19% | 2.70% | 1.77% |
| Prior art | External error X | 1.02% | 1.11% | 0.85% | 0.98% | 1.19% | 1.52% |
| | External error ○ | 7.55% | 7.91% | 8.04% | 7.98% | 8.42% | 8.92% |
| | SOC error increase amount | 6.53% | 6.80% | 7.19% | 7.00% | 7.23% | 7.40% |

In Table 1, the external error is an error due to the current sensor. On the other hand, the temperature-dependent error value according to the presence or absence of the external error is the difference between the actually measured charging capacity value and the charging capacity value calculated by the calculation method according to the present invention or the conventional method.

Referring to Table 1 and FIG. 6, if there is no external error (there is no error in the current sensor), it may be confirmed that the error of the charging capacity (SOC) calculated by the conventional technique is smaller than the SOC error calculated by the method of the present invention.

TABLE 2

| Error condition | Existing algorithm (prior art) | SOC calculation method of present invention |
|---|---|---|
| In current sensor specification, maximum ± 3% error | At 3%, Max error 2.5% | At 3%, Max error 1.0% |
| Customer requirement SOH error ± 5% Tolerance of process capacity ± 2.5% | At 7.5%, Max error 9% | At 7.5%, Max error 1.5% |

Referring to Table 2 and FIG. 7, when the current sensor has an error of +−3% (external error) (FIG. 7(a)), the maximum error of the charging capacity calculated by the existing algorithm is 2.5% but when the charging capacity (SOC) calculating method of the present invention is used (FIG. 7(b)), the maximum error of the charging capacity is 1% so that it may be confirmed that the charging capacity calculation method of the present invention has less error than the existing algorithm. In addition, when the degradation (SOH) error (external error) of the energy storage system is +−5% and the tolerance range (external error) of the process capacity generated in the fixation is +−2.5%, the maximum error of the charging capacity calculated by the existing algorithm is 9% but when the charging capacity calculation method of the present invention is used, it may be confirmed that the error of charging capacity is 1.5% at maximum.

As a result, as the external error is larger, it may be confirmed that the use of the charging capacity calculation method of the present invention produces less error as compared to measuring charging capacity using existing algorithms.

On the other hand, Table 3 and FIG. 8 are a table and a view for comparing the results of the capacity test using the existing algorithm and the charging capacity estimation method of the present invention.

TABLE 3

| SOC Max Error(%) | Existing algorithm (prior art) | SOC calculation method of present invention |
|---|---|---|
| Charging direction | 3.9% | 2% |
| Discharging direction | 5% | 2.8% |

As shown in Table 3 and FIG. 8, according to the capacity test using the existing algorithm, it may be confirmed that the maximum error is 3.9% in the charging direction and the maximum error is 5% in the discharging direction. In comparison to this, according to a result of the capacity test using the charging capacity calculating method of the present invention, it may be confirmed that the maximum error is 2% in the charging direction and the maximum error is 2% in the discharging direction.

As a result, it may be confirmed that the use of the charging capacity calculating method of the present invention results in a small error in the capacity test result for both charging/discharging.

On the other hand, in the conventional algorithm, when the maximum error as described above occurs, the current charging capacity may not be accurately determined, so that the energy storage system may continue charging or discharging for up to one minute. If charging or discharging is continued in this way, even within the maximum charging capacity or maximum discharging capacity of the energy storage system, charging or discharging may last and damage the energy storage system.

3. Energy Storage System According to Embodiment of Present Invention.

FIG. 9 is a view illustrating a configuration of an energy storage system according to an embodiment of the present invention.

Hereinafter, an energy storage system according to an embodiment of the present invention will be described with reference to FIG. 9.

The energy storage system 10 according to an embodiment of the present invention may include a plurality of battery racks 11 and a battery section controller (BSC) 110 for controlling the plurality of battery racks.

Specifically, the BSC 110 may be configured including a voltage measurement unit 120 for measuring the output voltage of the energy storage system, a current measurement unit 130 for measuring the output current of the energy storage system, a storage unit 140 in which a resistance and a capacitance lookup table of a temperature-dependent energy storage system calculated with a predetermined current having a constant value are stored, and a charging capacity calculation unit 150 for calculating a charging capacity of the energy storage system based on the measured voltage and current and the calculated resistance and capacitance.

The current having the constant value uses a current having a total of 2 to 3 c-rate or more. However, the inventor of the present invention invented that the resistance and the capacitance value of the energy storage system may be more accurately calculated by applying a c-rate current lower than 2 to 3c-rate.

Accordingly, in the present invention, the low c-rate current may be a current having a value between a minimum current value and a 2c-rate value capable of measuring the resistance and capacitance of the energy storage system.

Preferably, the current having the low c-rate may be a current of 0.1 c-rate, which corresponds to ¹⁄₁₀ of the current of 1 c-rate.

Meanwhile, the voltage measurement unit 120 may measure the first voltage, which is the voltage of the energy storage system while a predetermined current is applied to the energy storage system, and the second voltage, which is the voltage of the energy storage system after the current applied to the energy storage system is cut off.

Meanwhile, the current measurement unit 130 measures the output current of the energy storage system, and the measured output current of the energy storage system is used to calculate the charging capacity state variable value of the energy storage system described below.

The lookup table stored in the storage unit 140 may be performed and stored according to the method of calculating the resistance (R) and the capacitance (C) used to calculate the voltage model of the energy storage system according to the embodiment of the present invention described above.

Meanwhile, the charging capacity calculation unit 150 may be configured including a voltage state variable calculation unit 151 for calculating a state variable for the voltage of the energy storage system based on the resistance and the capacitance of the lookup table and a charging capacity state variable calculation unit 152 for calculating a state variable for a charging capacity of the energy storage system using a current integration method for integrating the measured output current of the energy storage system, and may calculate the charging capacity of the energy storage system by substituting the calculated voltage state variable and the charging capacity state variable into the Kalman filter.

The charging capacity of the specific energy storage system may be calculated by performing the procedure of the method of calculating the charging capacity of the energy storage system of the present invention described above.

For example, the charging capacity state variable calculated in the charging capacity state variable calculation unit may be time-updated according to Equation 1 below.

$$SOC[k+1] = SOC[k] - \frac{i[k]\Delta t}{Q_{capacity}} \quad \text{(Equation 1)}$$

(wherein Q_capacity: capacity of secondary battery, k: time index, I[k]: current measured at time index k, t: time)

Meanwhile, the calculated voltage state variable calculated in the voltage state variable calculation unit may be time-updated according to Equation 2 below.

$$V_1[k+1] = \exp\left(-\frac{\Delta t}{R_1 C_1}\right)V_1[k] + R_1\left(1 - \exp\left(-\frac{\Delta t}{R_1 C_1}\right)\right)I[k] \quad \text{(Equation 2)}$$

(wherein R1 and C1 are resistance and capacitance values included in the circuit model of FIG. 5, k: time index, I[k]: current measured at time index k, t: time)

On the other hand, although the technical idea of the present invention is specifically described with reference to the above embodiments, it should be noted that the above embodiments are for the purpose of explanation and not for the purpose of limitation. It will be apparent to those skilled in the art that various modifications and variations may be made in the present invention without departing from the spirit and scope of the invention.

The invention claimed is:

1. An energy storage system comprising:
 a plurality of battery racks; and
 a battery section controller (BSC) for controlling the plurality of battery racks,
 wherein the BSC comprises:
 a voltage measurement unit configured to measure:
 a first voltage while a predetermined current having a constant value at less than or equal to 0.1C rate is applied to the energy storage system; and
 a second voltage after the predetermined current applied to the energy storage system is cut off;
 a current measurement unit for measuring an output current of the energy storage system;
 a storage unit in which a resistance and capacitance look-up table of a temperature-dependent energy storage system calculated with the predetermined current is stored; and
 a charging capacity calculation unit for calculating a charging capacity of the energy storage system based on the resistance and capacitance look-up table, and
 wherein the BSC is configured to repeatedly calculate a resistance and a capacitance of the energy storage system while changing the temperature of the energy storage system based on the first voltage, the second voltage, and the predetermined current, and using a voltage model circuit, in order to form the resistance and capacitance look-up table.

2. The energy storage system of claim 1, wherein the predetermined current is between a minimum current value capable of measuring the resistance value and the capacitance value of the energy storage system and a current value at 0.1c-rate.

3. The energy storage system of claim 1, wherein the charging capacity calculation unit comprises:
 a voltage state variable calculation unit for calculating a voltage state variable for a voltage of the energy storage system based on the resistance and a capacitance of the lookup table; and
 a charging capacity state variable calculation unit for calculating a charging capacity state variable for a charging capacity of the energy storage system using a current integration method for integrating the measured output current,
 wherein the calculated voltage state variable and the charging capacity state variable are substituted into a Kalman filter to calculate the charging capacity of the energy storage system.

4. The energy storage system of claim 3, wherein the charging capacity state variable calculated in the charging capacity state variable calculation unit is time-updated according to Equation 1 below:

$$SOC[k+1] = SOC[k] - \frac{i[k]\Delta t}{Q_{capacity}} \quad \text{(Equation 1)}$$

wherein $Q_{\_capacity}$: capacity of secondary battery, k: time index, SOC[k]: state of charge at time index k, I[k]: current measured at time index k, t: time.

5. The energy storage system of claim 3, wherein the calculated voltage state variable calculated in the voltage state variable calculation unit is time-updated according to Equation 2 below:

$$V_1[k+1] = \exp\left(-\frac{\Delta t}{R_1 C_1}\right)V_1[k] + R_1\left(1 - \exp\left(-\frac{\Delta t}{R_1 C_1}\right)\right)I[k] \quad \text{(Equation 2)}$$

wherein $R_1$: resistance value, $C_1$: capacitance value, k: time index, I[k]: current measured at time index k, t: time, $V_1[k]$: voltage state at time index k.

* * * * *